United States Patent
Yu et al.

(10) Patent No.: US 12,426,170 B2
(45) Date of Patent: Sep. 23, 2025

(54) DISPLAY DEVICE AND POSITIONING ELEMENT THEREOF

(71) Applicant: AmTRAN Technology Co., Ltd., New Taipei (TW)

(72) Inventors: Chen-Han Yu, New Taipei (TW); Chih Kuei Wang, New Taipei (TW); Chih Chien Hung, New Taipei (TW)

(73) Assignee: AmTRAN Technology Co., Ltd., New Taipei (TW)

( * ) Notice: Subject to any disclaimer, the term of this patent is extended or adjusted under 35 U.S.C. 154(b) by 239 days.

(21) Appl. No.: 18/454,056

(22) Filed: Aug. 22, 2023

(65) Prior Publication Data
US 2024/0334620 A1   Oct. 3, 2024

(30) Foreign Application Priority Data

Mar. 31, 2023   (TW) ................. 112112721

(51) Int. Cl.
  *H05K 5/02*    (2006.01)
  *H05K 5/00*    (2006.01)
  *H05K 5/10*    (2025.01)

(52) U.S. Cl.
  CPC ......... *H05K 5/0018* (2022.08); *H05K 5/0217* (2013.01); *H05K 5/0247* (2013.01); *H05K 5/10* (2025.01)

(58) Field of Classification Search
  CPC .. H05K 5/0018; H05K 5/0217; H05K 5/0247; H05K 5/10; G02F 1/1333; G02F 1/133308; G02F 1/133314; G02F 1/133317; G02F 1/133322; G09F 9/30
  See application file for complete search history.

(56) References Cited

FOREIGN PATENT DOCUMENTS

| CN | 207164415 U | 3/2018 |
| CN | 112394569 A | 2/2021 |
| CN | 216622917 U | 5/2022 |
| KR | 10-2297832 B1 | 9/2021 |
| TW | 202234133 A | 9/2022 |

OTHER PUBLICATIONS

English Translation of CN216622917, May 27, 2022, machine translated on Jun. 14, 2025. (Year: 2025).*

* cited by examiner

*Primary Examiner* — Imani N Hayman
*Assistant Examiner* — Hung Q Dang
(74) *Attorney, Agent, or Firm* — CKC & Partners Co., LLC

(57) ABSTRACT

A display device includes a back board, a display assembly, and a positioning element. The back board includes a bottom plate, a first side plate, and a second side plate. The bottom plate, the first side plate, and the second side plate jointly define an accommodating space, and an opening is between the first side plate and the second side plate. The display assembly is located in the accommodating space. The positioning element is fixed on the back board and includes a filling block, a first sidewall, and a second sidewall. The filling block is engaged with the opening. The first sidewall is connected to the filling block and faces toward an inner side surface of the first side plate. The second sidewall is connected to the filling block and faces toward an inner side surface of the second side plate.

20 Claims, 11 Drawing Sheets

DISPLAY DEVICE AND POSITIONING ELEMENT THEREOF

CROSS-REFERENCE TO RELATED APPLICATION

This application claims priority to Taiwan Application Serial Number 112112721, filed Mar. 31, 2023, which is herein incorporated by reference in its entirety.

BACKGROUND

Field of Invention

The present disclosure relates to a display device and a positioning element thereof, especially a display device related to a backlight module and a positioning element for the backlight module.

Description of Related Art

In existing designs, a positioning element (e.g., a rubber block) is provided in some backlight modules, in which the positioning element is configured to position, support, and collision buffering of optical materials or optical films. In order to allow the positioning element to be stably fixed on the back board, the surface of the positioning element usually needs to be roughened, and then the double-sided tape is attached to the roughened surface of the positioning element. Then, the positioning element is attached to the back board, so as to achieve the effect of positioning, supporting, and buffering the collision onto the optical materials or optical films.

However, the aforementioned steps are relatively complicated in process and costly in manufacture. In addition, because the conventional positioning element cannot be fixed in three dimensions relative to the back board, the positioning element is not stably fixed on the back board and may fall off from the back board. The risk of collision damage to optical materials or optical films may also increase as a result.

Therefore, how to propose a display device and positioning element thereof to ensure that the positioning element in the display device is positioned on the back board and reduce the risk of collision damage to optical materials or optical films, and at the same time meet the needs of reducing production costs. It is one of the problems that the industry is eager to invest in research and development resources to solve.

SUMMARY

In view of this, one purpose of the present disclosure is to provide a display device and a positioning element thereof that can solve the aforementioned problems.

In order to achieve the above objective, according to an embodiment of the present disclosure, a display device includes a back board, a display assembly, and a positioning element. A back board includes a bottom plate, a first side plate, and a second side plate. The first side plate is bent from the bottom plate and extended in a first direction. The second side plate is bent from the bottom plate and extended in a second direction different from the first direction. The bottom plate, the first side plate, and the second side plate jointly define an accommodating space, and an opening is located between the first side plate and the second side plate. The display assembly is fixed on the back board and located in the accommodating space. The positioning element is fixed on the back board. The positioning element includes a filling block, a first sidewall, and a second sidewall. The filling block is engaged with the opening. The first sidewall is connected to the filling block and faces toward an inner side surface of the first side plate. The second sidewall is connected to the filling block and faces toward an inner side surface of the second side plate.

In one or more embodiments of the present disclosure, the first side plate further comprises a first extending bump. The second side plate further comprises a second extending bump. The filling block is partially located between the bottom plate and the first extending bump and is partially located between the bottom plate and the second extending bump.

In one or more embodiments of the present disclosure, the inner side surface of the first side plate is perpendicular to the inner side surface of the second side plate.

In one or more embodiments of the present disclosure, the filling block further includes a main bump, a first extending bump, and a second extending bump. The first extending bump is engaged with an edge of the first side plate adjacent to the opening. The second extending bump is engaged with an edge of the second side plate adjacent to the opening.

In one or more embodiments of the present disclosure, the main bump is connected to the first extending bump and the second extending bump.

In one or more embodiments of the present disclosure, the first extending bump protrudes in the first direction, and the second extending bump protrudes in the second direction.

In one or more embodiments of the present disclosure, the positioning element further includes a main bump, a first auxiliary bump, and a second auxiliary bump. The first auxiliary bump is connected to the first sidewall. The second auxiliary bump is connected to the second sidewall. The first auxiliary bump and the second auxiliary bump are respectively separated from the main bump.

In one or more embodiments of the present disclosure, the first auxiliary bump is located on a side of the first sidewall away from the main bump, and the second auxiliary bump is located on a side of the second sidewall away from the main bump.

In one or more embodiments of the present disclosure, the filling block has a surface located on a side of the filling block away from the first sidewall and/or the second sidewall.

In one or more embodiments of the present disclosure, the surface of the filling block is a curved surface.

In one or more embodiments of the present disclosure, the first sidewall and the second sidewall respectively abut against the first side plate and the second side plate as the filling block is engaged with the opening.

In one or more embodiments of the present disclosure, the display assembly further includes a reflective display, a light guide plate, a diffuser, a lower prism sheet, and an upper prism sheet. The reflective display is disposed on the bottom plate. The light guide plate is disposed on the reflective display. The diffuser is disposed on a side of the light guide plate away from the reflective display. The lower prism sheet is disposed on a side of the diffuser away from the reflective display. The upper prism sheet is disposed on the lower prism sheet.

In order to achieve the above objective, according to an embodiment of the present disclosure, a positioning element of a display device includes a first sidewall, a second sidewall, and a filling block. The first sidewall is extended in a first direction. The second sidewall is extended in a second direction different from the first direction. The filling block is disposed on an outer surface of the first sidewall and an outer surface of the second sidewall and is connected between the first sidewall and the second sidewall.

In one or more embodiments of the present disclosure, the filling block further includes a main bump, a first extending bump, and a second extending bump. The first extending bump is extended from the main bump and connected to the first sidewall. The second extending bump is extended from the main bump and connected to the second sidewall.

In one or more embodiments of the present disclosure, the first extending bump protrudes in the first direction, and the second extending bump protrudes in the second direction.

In one or more embodiments of the present disclosure, the positioning element further includes a main bump, a first auxiliary bump, and a second auxiliary bump. The first auxiliary bump is connected to the first sidewall. The second auxiliary bump is connected to the second sidewall. The first auxiliary bump and the second auxiliary bump are respectively separated from the main bump.

In one or more embodiments of the present disclosure, the first auxiliary bump is located on a side of the first sidewall away from the main bump, and the second auxiliary bump is located on a side of the second sidewall away from the main bump.

In one or more embodiments of the present disclosure, the filling block has a surface located on a side of the filling block away from the first sidewall and/or the second sidewall.

In one or more embodiments of the present disclosure, the surface of the filling block is a curved surface.

In one or more embodiments of the present disclosure, the first sidewall is perpendicular to the second sidewall.

In summary, in the display device and its positioning element of the present disclosure, the presence of the opening between the first side plate and the second side plate. The positioning element has the corresponding first sidewall, the corresponding second sidewall, and the corresponding filling block, such that the positioning element can be stably positioned by the opening, the first side plate, and the second side plate at least in two dimensions as the positioning element moves away from the display assembly. In the display device and its positioning element of the present disclosure, since the first side plate and the second side plate respectively include the first extending bump and the second extending bump and have the recess or the through hole, and the positioning element includes the first extending bump, the second extending bump, the first auxiliary bump, and the second auxiliary bump corresponding to the recess or the through hole, so that the first protruding portion and the second protruding portion can respectively block the first extending bump and the second extending bump in the third dimension as the positioning element moves away from the display assembly. Alternatively, the through hole can block the first auxiliary bump and the second auxiliary bump in the third dimension respectively so as to achieve effect of the positioning element firmly fixed relative to the back board in three dimensions. In this way, the display device of the present disclosure has the integrally formed back board and positioning elements thereof. After the back board and the positioning element are formed, no additional processing is required. During the assembling process of the display device, not only the purposes of positioning element firmly fixed on the back board and preventing light leakage at the corners of the back board can be achieved, but also can reduce the risk of collision damage to optical materials or optical films, and meet the demand for reducing production costs at the same time.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
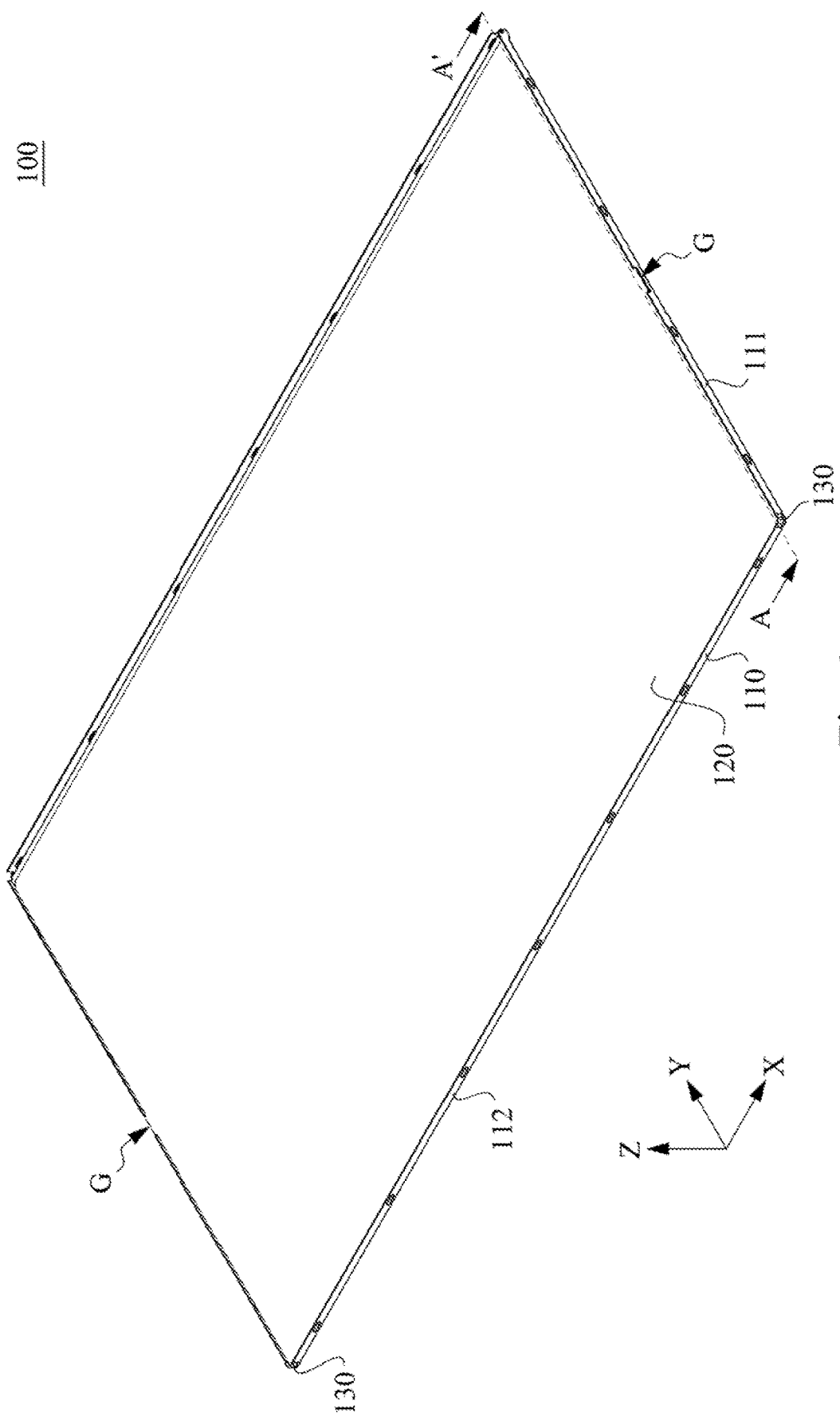
FIG. 1 is a perspective view of a display device in accordance with an embodiment of the present disclosure.

Hereinafter, a plurality of embodiments of the present disclosure will be disclosed in diagrams. For the sake of clarity, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a display device 100 of this embodiment and the connection relationship between the components will be described in detail.

Reference is made to FIG. 1. FIG. 1 is a perspective view of a display device 100 according to an embodiment of the present disclosure. In this embodiment, the display device 100 includes a back board 110, a display assembly 120, and a positioning element 130. The display assembly 120 is fixed on the back board 110. The positioning element 130 is located at the corners of the back board 110, as shown in FIG. 1. The back board 110 is configured to accommodate the display assembly 120, and the positioning element 130 is configured to position the display assembly 120 in the back board 110 and prevent light leakage from openings at the corners of the back board 110.

In some embodiments, as shown in FIG. 1, the number of positioning element 130 in the display device 100 is two, but the present disclosure is not limited thereto. In some other embodiments, positioning element 130 may be disposed at four corners of the back board 110, so the number of positioning element 130 in the display device 100 may be four. The present disclosure is not intended to limit the number of positioning element 130 in the display device 100.

Reference is made again to FIG. 1. In some embodiments, the back board 110 has a plurality of grooves G. Specifically, the back board 110 includes a first side plate 111 and a second side plate 112, and the grooves G are located on the first side plate 111 and the second side plate 112. The display assembly 120 and the back board 110 are engaged with each other by the grooves G. Accordingly, the display assembly 120 may be fixed on the back board 110. However, the display assembly 120 and the back board 110 may be fixed to each other by any possible structures, methods, and means.

In some embodiments, the display assembly 120 may include a backlight module. In some embodiments, the display assembly 120 may include, for example, an edge-lit backlight module using an edge-lit backlight source (not shown). However, the present disclosure is not limited thereto.

Figure 2:
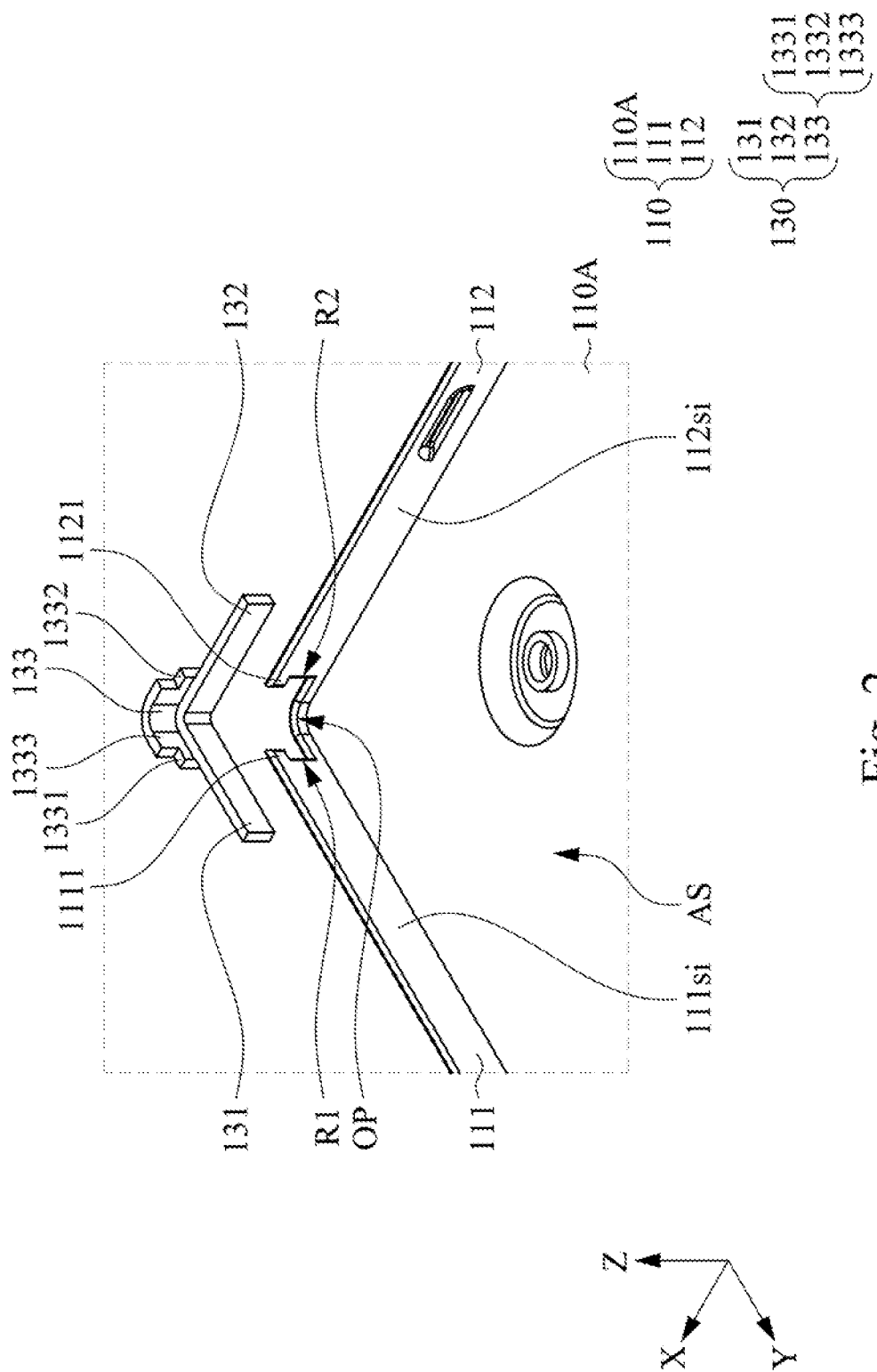
FIG. 2 is a partial exploded view of a positioning element and a back board in accordance with an embodiment of the present disclosure.

Reference is made to FIG. 2. FIG. 2 is a partial exploded view of the positioning element 130 and the back board 110 according to an embodiment of the present disclosure. It should be noted that, for simplicity, the display assembly 120 is omitted in FIG. 2. In this embodiment, as shown in FIG. 2, the back board 110 includes a bottom plate 110A, a first side plate 111, and a second side plate 112. The first side plate 111 and the second side plate 112 are respectively bent from the bottom plate 110A. In some embodiments, as shown in FIG. 2, the first side plate 111 is extended in a first direction (e.g., y-direction), and the second side plate 112 is extended in a second direction (e.g., x-direction). In some embodiments, the display device 100 substantially includes two first side plates 111 and two second side plates 112. As shown in FIG. 2, an opening OP is located between the first side plate 111 and the second side plate 112, and the opening OP is configured to be engaged with the positioning element 130. As shown in FIG. 2, the first side plate 111 and the second side plate 112 jointly define an accommodating space AS configured to accommodate the display assembly 120.

In some embodiments, the first side plate 111 and the bottom plate 110A are bent perpendicular to each other. In some embodiments, the second side plate 112 and the bottom plate 110A are bent perpendicular to each other. In some embodiments, the back board 110 is integrally formed by metal stamping. Therefore, the process of assembling the first side plate 111 and the second side plate 112 can be omitted during the production the display device 100.

Reference is made again to FIG. 2. In this embodiment, the positioning element 130 is fixed on the back board 110 by the opening OP. As shown in FIG. 2, the positioning element 130 further includes a first sidewall 131, a second sidewall 132, and a filling block 133. The filling block 133 is connected between the first sidewall 131 and the second sidewall 132, and filling block 133 is engaged with the opening OP. The first sidewall 131 faces toward an inner surface 111si of the first side plate 111, and the second sidewall 132 faces toward an inner surface 112si of the second side plate 112. As shown in FIG. 2, the first side plate 111 and the second side plate 112 are respectively configured to allow the first sidewall 131 and the second sidewall 132 to abut against as the filling block 133 is engaged with the opening OP toward the outer side of the first side plate 111 and the second side plate 112. In some embodiments, the positioning element 130 is integrally formed of rubber or plastic material.

Reference is made again to FIG. 2. In some embodiments, the first side plate 111 further includes a first protruding portion 1111, and the second side plate 112 further includes a second protruding portion 1121. The first protruding portion 1111 is extended from an edge of the first side plate 111 close to the opening OP along the first direction (e.g., y-direction), and the second protruding portion 1121 is extended from an edge of the second side plate 112 close to the opening OP along the second direction (e.g., x-direction), such that the filling block 133 is partially located between the bottom plate 110A and the first protruding portion 1111 and is partially located between the bottom plate 110A and the second protruding portion 1121. Therefore, a width of the side of the opening OP close to the bottom plate 110A is greater than a width of the side away from the bottom plate 110A. In some embodiments, as shown in FIG. 2, the opening OP is in an upside-down "capital T" shape. Accordingly, the aforementioned first protruding portion 1111 and the aforementioned second protruding portion 1121 may be configured to block the movement of the positioning element 130 in the third direction (e.g., the z-direction).

Reference is made again to FIG. 2. In some embodiments, the filling block 133 further includes a first extending bump 1331, a second extending bump 1332, and a main bump 1333. The main bump 1333 is connected to the first extending bump 1331 and the second extending bump 1332. The first extending bump 1331 is extended from the main bump 1333, and the second extending bump 1332 is extended from the main bump 1333. In some embodiments, as shown in FIG. 2, the first side plate 111 and the second side plate 112 have recess R1 and recess R2, respectively. In detail, the recess R1 is located on the first side plate 111 and is recessed along the first direction (e.g., y-direction), and the recess R1 communicates with the opening OP. The recess R2 is located on the second side plate 112 and is recessed along the second direction (e.g., x-direction), and the recess R2 communicates with the opening OP. In this case, the filling block 133 is partially engaged with the recess R1 and partially engaged with the recess R2. Specifically, as shown in FIG. 2, the shape of the recess R1 and the recess R2 matches the shape of the first extending bump 1331 and the second extending bump 1332, respectively.

In some embodiments, the material of the positioning element 130 is flexible material. In some embodiments, the material of the positioning element 130 may be rubber, for example. However, any suitable material may be used to manufacture the positioning element 130.

In some embodiments, the inner surface 111si of the first side plate 111 and the inner surface 112si of the second side plate 112 are perpendicular to each other.

Figure 3:
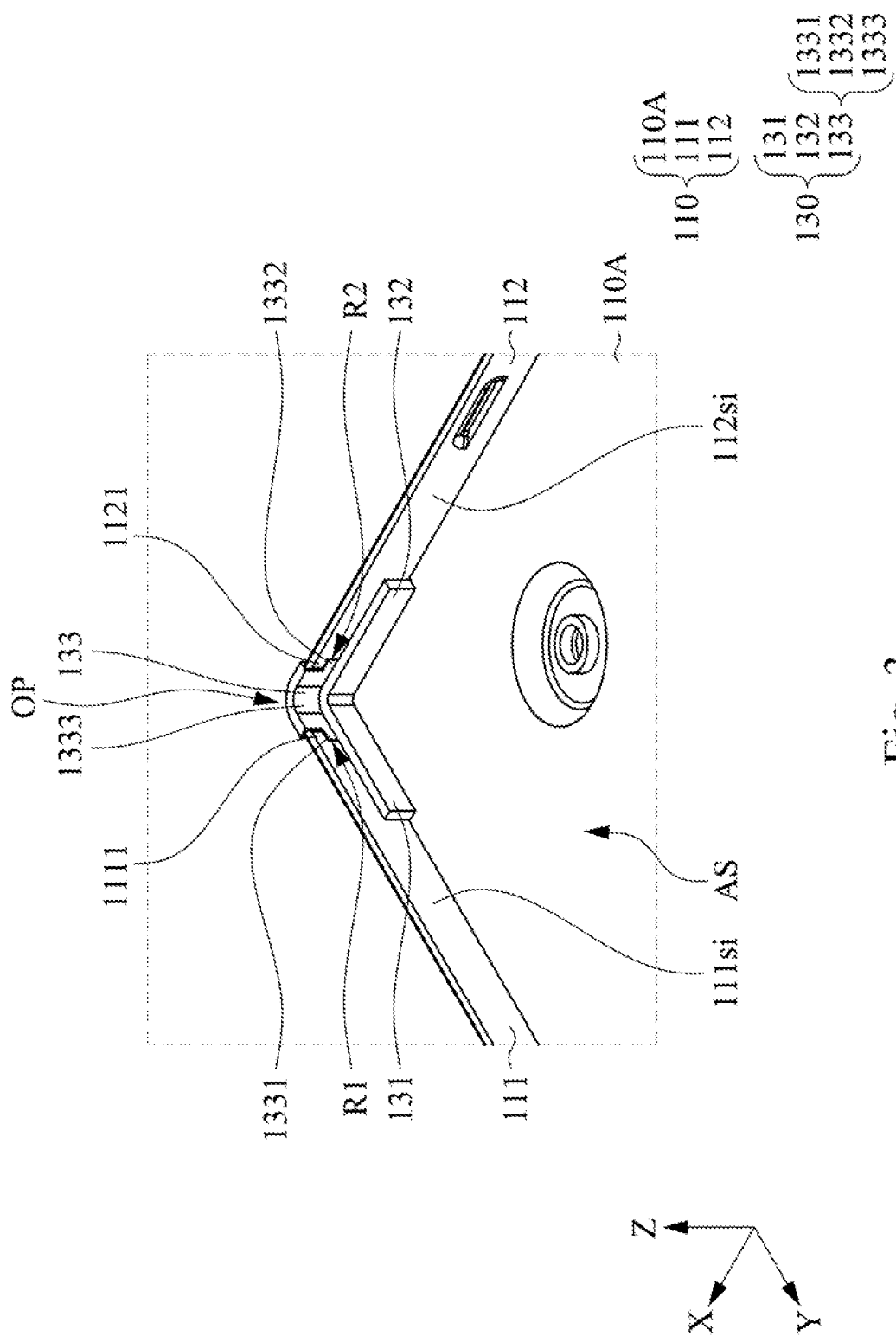
FIG. 3 is a partial perspective view of the positioning element engaged with the back board in accordance with an embodiment of the present disclosure.

Reference is made to FIG. 3. FIG. 3 is a partial perspective view of the positioning element 130 engaged with the back board 110 according to an embodiment of the present disclosure. In a practical scenario, when a user moves the positioning element 130 from the accommodating space AS toward the outer side of the first side plate 111 and the second side plate 112 and allows the positioning element 130 to be engaged with the opening OP located between the first side plate 111 and the second side plate 112, the filling block 133 (or, the main bump 1333) of the positioning element 130 is engaged with the opening OP, the first extending bump 1331 and the second extending bump 1332 are respectively engaged with the recess R1 and the recess R2. Moreover, in the embodiment, where the positioning element 130 is a flexible material, when the filling block 133 is temporarily deformed (e.g., compressed) by the constraints of the opening OP, the filling block 133 returns to its original shape and is firmly engaged with the opening OP for completely sealing the opening OP. In addition, when the user moves the positioning element 130 from the accommodating space AS toward the outer side of the first side plate 111 and the second side plate 112 and allows the positioning element 130 to be engaged with the opening OP located between the first side plate 111 and the second side plate 112, the first sidewall 131 and the second sidewall 132 of the positioning element 130 are able to abut against the first side plate 111 and the second side plate 112, respectively. This configuration prevents the positioning element 130 from continuously moving along the first direction (e.g., y-direction) and/or the second direction (e.g., x-direction). Furthermore, when the user moves the positioning element 130 from the accommodating space AS toward the outer side of the first side plate 111 and the second side plate 112 and allows the positioning element 130 to be engaged with the opening OP located between the first side plate 111 and the second side plate 112, the first protruding portion 1111 and the second protruding portion 1121 respectively block the first extending bump 1331 and the second extending bump 1332 of the filling block 133, so as to prevent the positioning element 130 from continuously moving along the third direction (e.g., the z-direction). In this way, the positioning element 130 can be fixed on the back board 110 to achieve the effect that the positioning element 130 can be positioned relative to the back board 110 in three dimensions.

Figure 4:
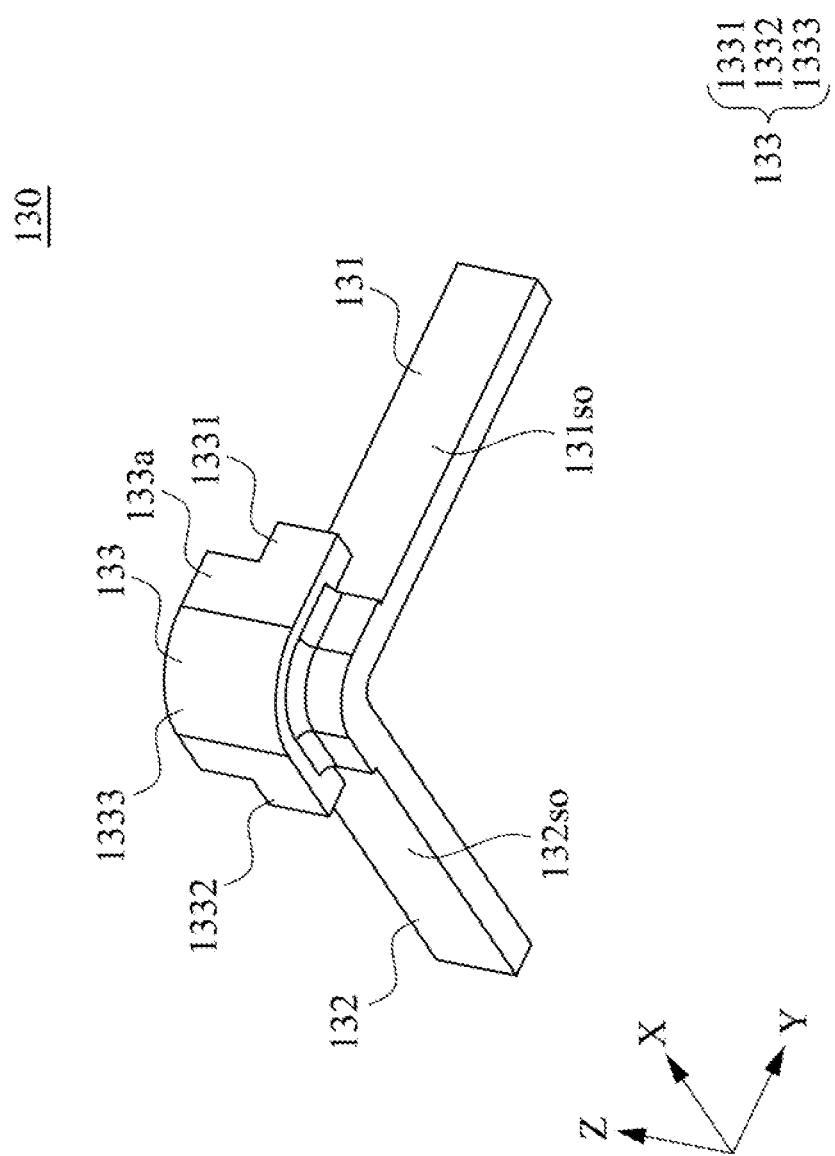
FIG. 4 is a perspective view of the positioning element in accordance with an embodiment of the present disclosure.

Reference is made to FIG. 4. FIG. 4 is a perspective view of the positioning element 130 according to an embodiment of the present disclosure. In some embodiments, the first extending bump 1331 of the filling block 133 is extended from the main bump 1333 and is connected to the first sidewall 131. In some embodiments, the second extending bump 1332 of the filling block 133 is extended from the main bump 1333 and is connected to the second sidewall 132. In some embodiments, the filling block 133 is disposed on an outer surface 131so of the first sidewall 131 and an outer surface 132so of the second sidewall 132.

In some embodiments, the first sidewall 131 and the second sidewall 132 are perpendicular to each other.

In some embodiments, as shown in FIG. 4, the first extending bump 1331 protrudes from the main bump 1333 along the first direction (e.g., y-direction). In some embodiments, the second extending bump 1332 protrudes from the main bump 1333 along the second direction (e.g., x-direction).

In some embodiments, as shown in FIG. 4, the filling block 133 has a surface 133a, and the surface 133a is located on a side of the filling block 133 away from the first sidewall 131 and/or the second sidewall 132. The surface 133a of the filling block 133 is a curved surface.

Figure 5:
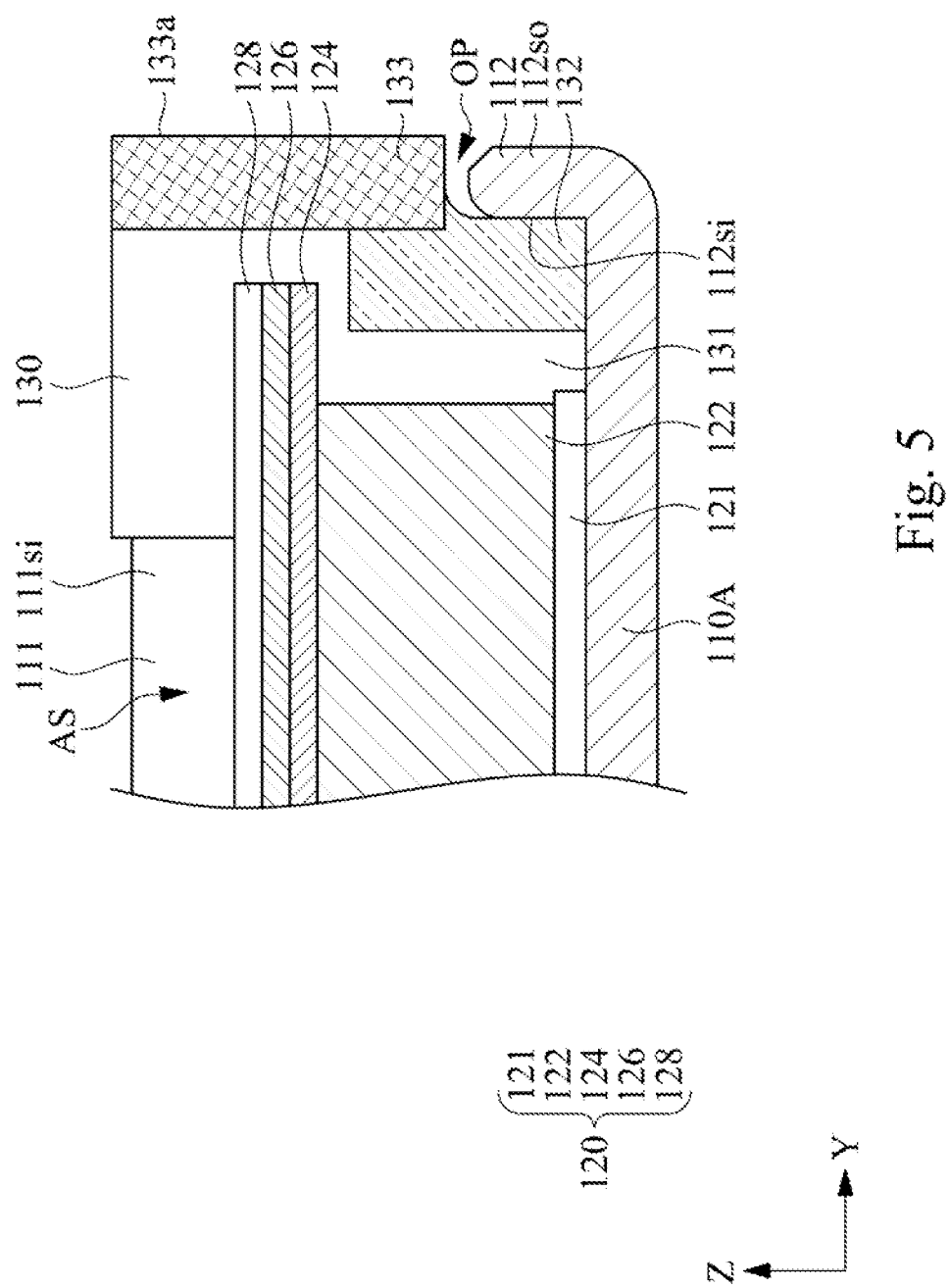
FIG. 5 is a partial cross-sectional view of the display device along a section A-A' of FIG. 1 in accordance with an embodiment of the present disclosure.

Reference is made to FIG. 5. FIG. 5 is a partial cross-sectional view of the display device 100 along a section A-A' shown in FIG. 1 according to an embodiment of the present disclosure. In some embodiments, as shown in FIG. 5, the display assembly 120 further includes a reflective display 121, a light guide plate 122, a diffuser 124, a lower prism sheet 126, and an upper prism sheet 128. The reflective display 121 is disposed on the bottom plate 110A. The light guide plate 122 is disposed on the reflective display 121. The diffuser 124 is disposed on a side of the light guide plate 122 away from the reflective display 121. The lower prism sheet 126 is disposed on a side of the diffuser 124 away from the reflective display 121. The upper prism sheet 128 is disposed on the lower prism sheet 126. It should be noted that the connection relationship and relative position among the reflective display 121, the light guide plate 122, the diffuser 124, the lower prism sheet 126, and the upper prism sheet 128 can be changed arbitrarily according to the user's optical requirements, so the present disclosure is not intended to limit the structure, function, and connection relationship between the elements included in the display assembly 120.

Reference is made again to FIG. 5. In some embodiments, the filling block 133 protrudes from the first sidewall 131 and the second sidewall 132 toward a direction away from the display assembly 120. In this case, when the user moves the positioning element 130 away from the display assembly 120 and allows the positioning element 130 to be engaged with the opening OP located between the first side plate 111 and the second side plate 112, the filling block 133 can be more reliably limited by the opening OP. For example, as shown in FIG. 5, when the filling block 133 is engaged with the opening OP, at least the second sidewall 132 abuts against the inner surface 112si of the second side plate 112.

Reference is made again to FIG. 5. In some embodiments, when the positioning element 130 is fixed on the back board 110 by the opening OP, the first sidewall 131 is located between the first side plate 111 and the display assembly 120, and the second sidewall 132 is located between the second side plate 112 and the display assembly 120.

In some embodiments, as shown in FIG. 5, the surface 133a of the filling block 133 protrudes relative to the outer surface 112so of the second side plate 112. In some other embodiments, the surface 133a of the filling block 133 is leveled with the outer surface 112so of the second side plate 112.

Next, the structure, function, and connection relationship between the components included in the display device 100 according to another embodiment of the present disclosure will be introduced in detail below.

Figure 6:
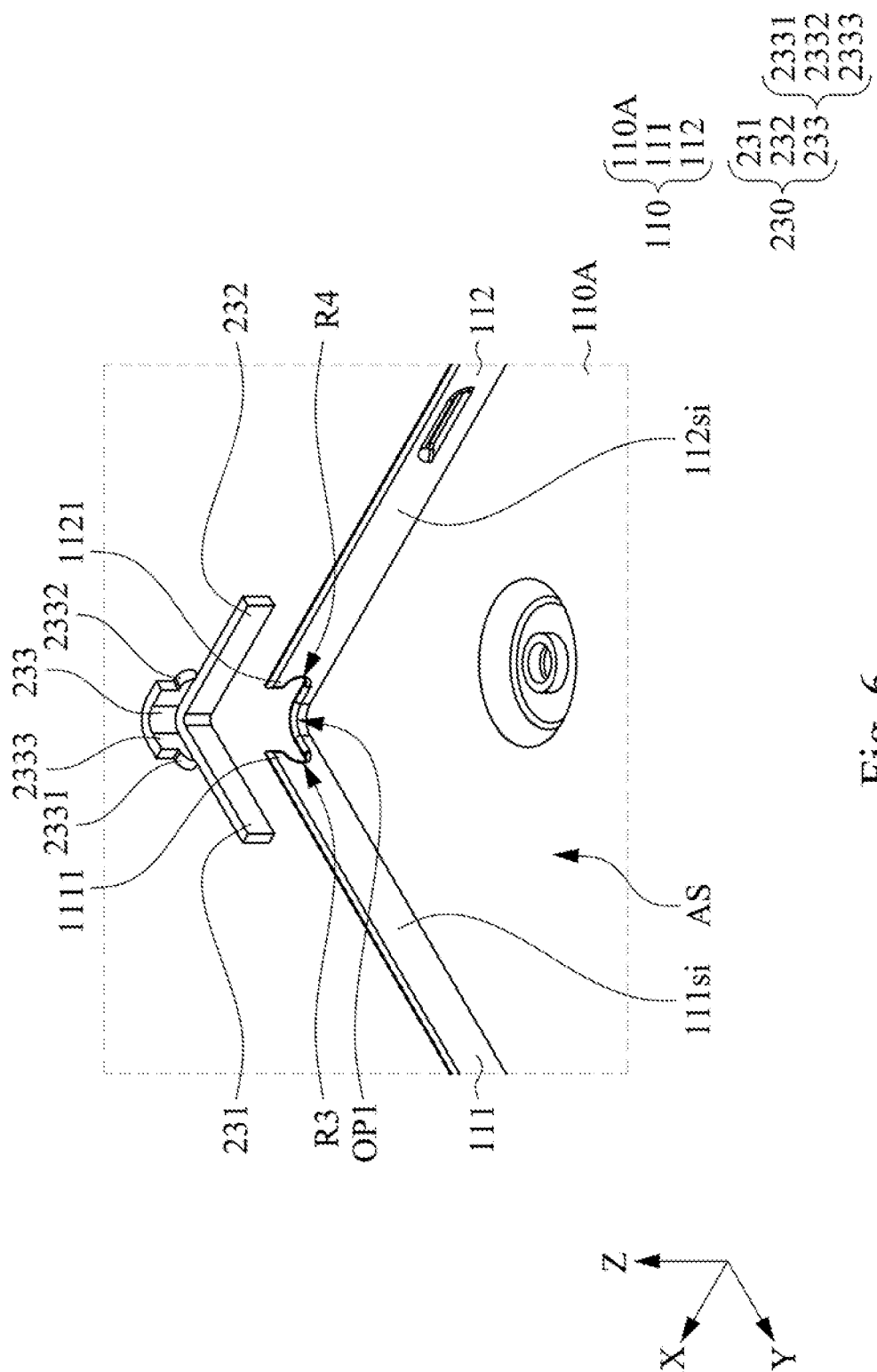
FIG. 6 is a partial exploded view of a positioning element and a back board in accordance with another embodiment of the present disclosure.

Reference is made to FIG. 6. FIG. 6 is a partial exploded view of the positioning element 230 and the back board 110 according to another embodiment of the present disclosure. It should be noted that, for simplicity, the display assembly 120 is also omitted in FIG. 6. The positioning element 230 in FIG. 6 is substantially similar to the positioning element 130 in FIG. 2 in terms of structural configuration, the difference is that the filling block 233 of the positioning element 230 includes a first extending bump 2331 and a second extending bump 2332, in which the shape of the first extending bump 2331 and the second extending bump 2332 is rounded, which is different from the first extending bump 1331 and the second extending bump 1332 in FIG. 2 being rectangular. For example, the first extending bump 2331 and the second extending bump 2332 are in semicircular shape. However, the present disclosure is not intended to limit the shapes of the first extending bump 2331 and the second extending bump 2332.

Reference is made again to FIG. 6. In some embodiments, an opening OP1 is located between the first side plate 111 and the second side plate 112. In some embodiments, the first side plate 111 and the second side plate 112 respectively have a recess R3 and a recess R4. In detail, the recess R3 is located on the first side plate 111 and is recessed along the first direction (e.g., y-direction), and the recess R3 communicates with the opening OP1. The recess R4 is located on the second side plate 112 and is recessed along the second direction (e.g., x-direction), and the recess R4 communicates with the opening OP1. In this case, the shape of the recess R3 and the recess R4 and the shape of the first extending bump 2331 and the second extending bump 2332 are rounded.

Figure 7:
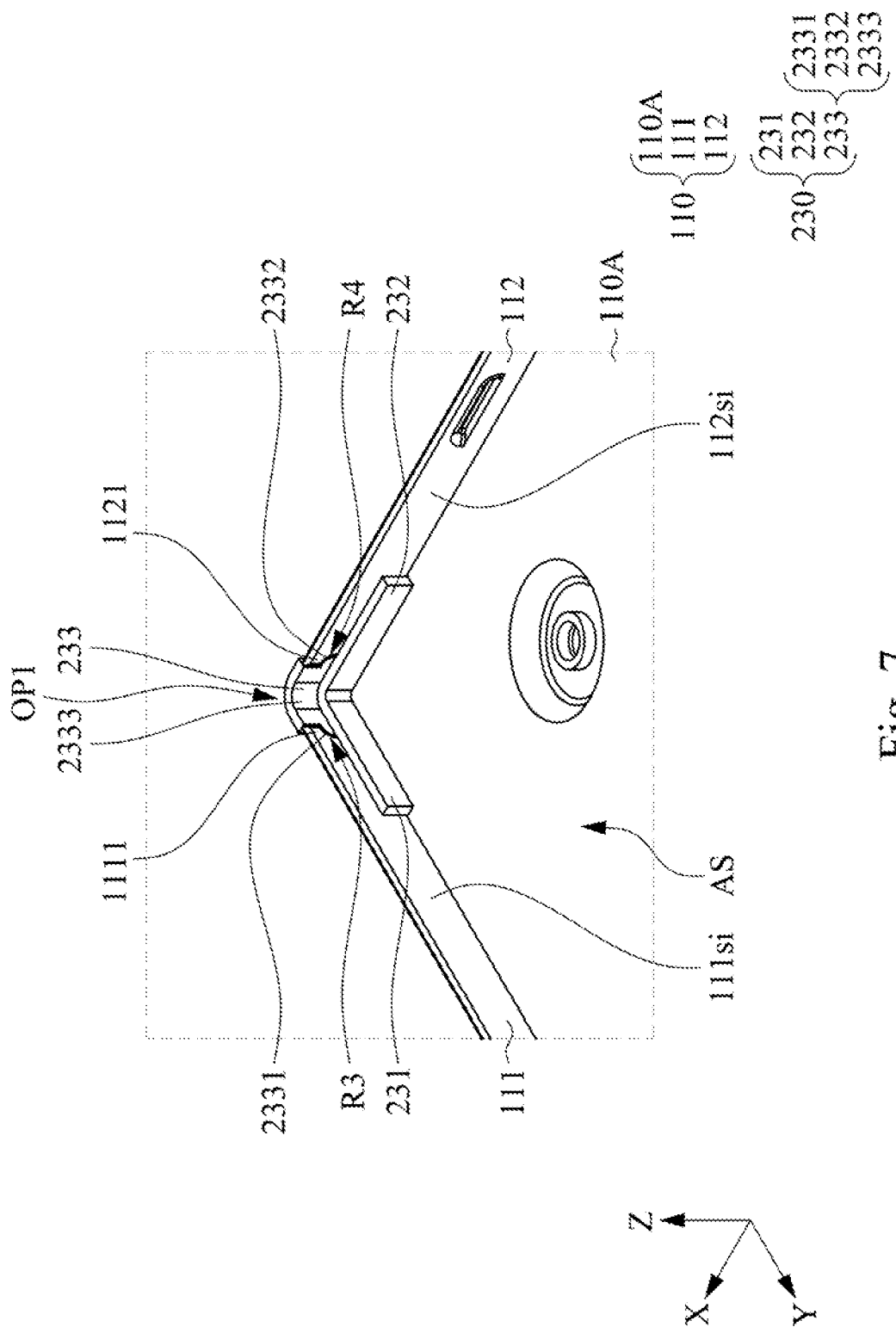
FIG. 7 is a partial perspective view of the positioning element engaged with the back board in accordance with another embodiment of the present disclosure.

Reference is made to FIG. 7. FIG. 7 is a partial perspective view of the positioning element 230 engaged with the back board 110 according to another embodiment of the present disclosure. In a practical scenario, when the user moves the positioning element 230 from the accommodating space AS toward the outer side of the first side plate 111 and the second side plate 112 and allows the positioning element 230 to be engaged with the opening OP1 located between the first side plate 111 and the second side plate 112, the filling block 233 (or main bump 2333) of the positioning element 230 is engaged with the opening OP1, and the first extending bump 2331 and the second extending bump 2332 are respectively engaged with the recess R3 and the recess R4, and when the filling block 233 is temporarily deformed (e.g., compressed) by the constraints of the opening OP1, the filling block 233 returns to its original shape and is firmly engaged with the opening OP1. In addition, when the user moves the positioning element 230 from the accommodating space AS toward the outer side of the first side plate 111 and the second side plate 112 and allows the positioning element 230 to be engaged with the opening OP1 located between the first side plate 111 and the second side plate 112, the first side plate 111 and the second side plate 112 are respectively configured to allow the first sidewall 231 and the second sidewall 232 of the positioning element 230 to abut against, so as to prevent the positioning element 230 from continuous moving along the first direction (e.g., y-direction) and/or the second direction (e.g., x-direction). Moreover, when the user moves the positioning element 230 from the accommodating space AS toward the outer side of the first side plate 111 and the second side plate 112 and allows the positioning element 230 to be engaged with the opening OP1 located between the first side plate 111 and the second side plate 112, the first protruding portion 1111 and the second protruding portion 1121 respectively block the first extending bump 2331 and the second extending bump 2332 of the filling block 233, so as to prevent the positioning element 230 from continuous moving along the third direction (e.g., the z-direction). In this way, the positioning element 230 can be fixed on the back board 110 to achieve the effect that the positioning element 230 can be positioned relative to the back board 110 in three dimensions.

Figure 8:
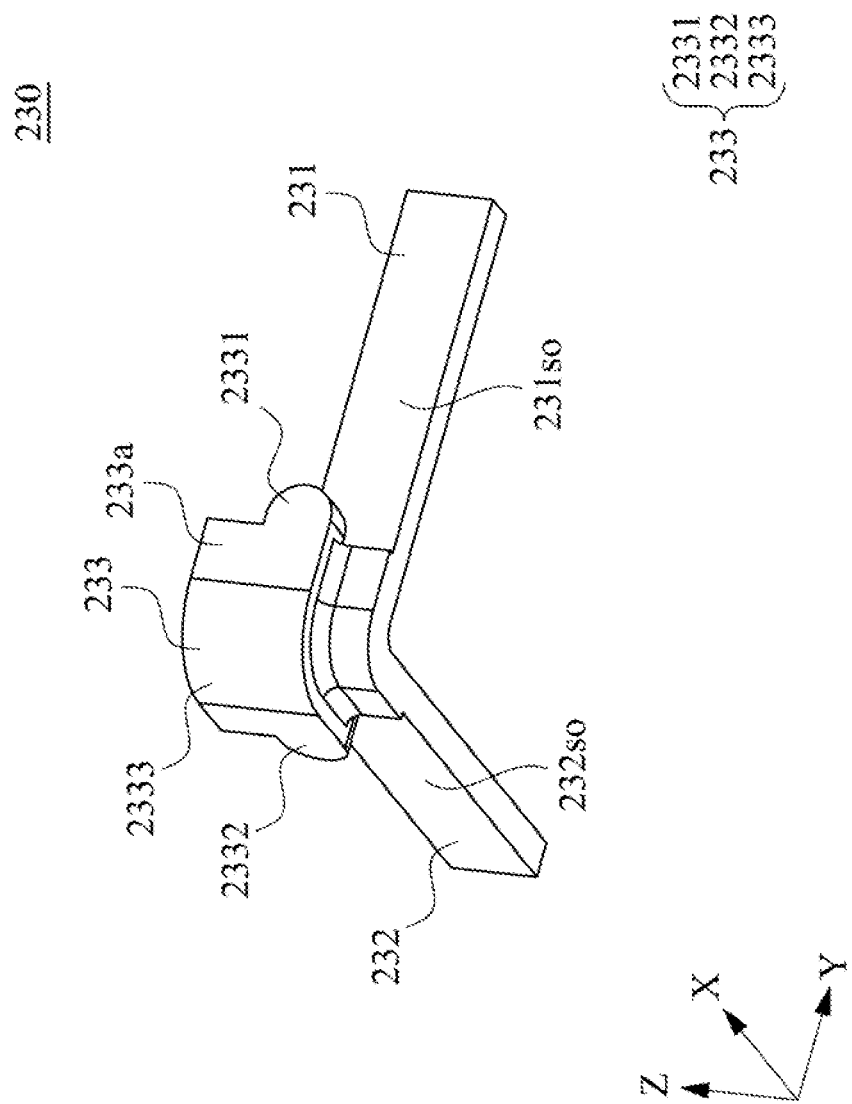
FIG. 8 is a perspective view of the positioning element in accordance with another embodiment of the present disclosure.

Reference is made to FIG. 8. FIG. 8 is a perspective view of the positioning element 230 according to another embodiment of the present disclosure. As shown in FIG. 8, the filling block 233 is disposed on an outer surface 231so of the first sidewall 231 and an outer surface 232so of the second sidewall 232. In some embodiments, the filling block 233 of the positioning element 230 has a surface 233a, and the shape of the surface 233a is different from the shape of the surface 133a of the filling block 133 of the positioning element 130. In some embodiments, the surface 233a is located on a side of the filling block 233 away from the first sidewall 231 and/or the second sidewall 232. The structural configuration of the positioning element 230 in the FIG. 8 is generally similar to the structural configuration of the positioning element 130 in the FIG. 4, and the specific differences in the structural configuration between the positioning element 230 in the FIG. 8 and the positioning element 130 in the FIG. 4 is described above, the following will not be repeated accordingly.

Next, the structure, function, and connection relationship of each element included in the display device 100 according to yet another embodiment of the present disclosure will be described in detail below.

Figure 9:
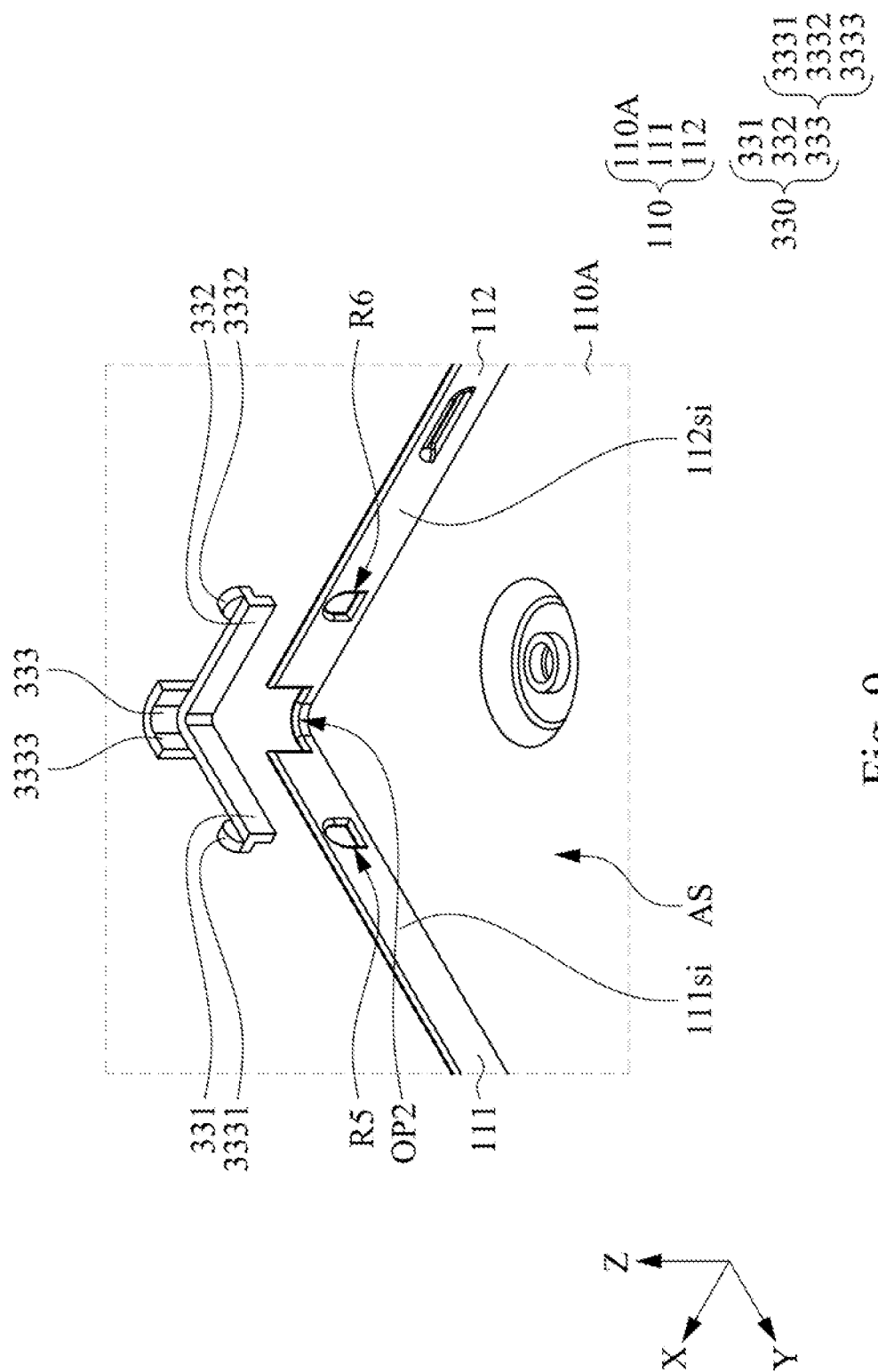
FIG. 9 is a partial exploded view of a positioning element and a back board in accordance with yet another embodiment of the present disclosure.

Reference is made to FIG. 9. FIG. 9 is a partial exploded view of the positioning element 330 and the back board 110 according to yet another embodiment of the present disclosure. It should be noted that, for simplicity, the display assembly 120 is also omitted in FIG. 9. In this embodiment, as shown in FIG. 9, an opening OP2 is located between the first side plate 111 and the second side plate 112, and the opening OP2 is configured to be engaged with the positioning element 330. The positioning element 330 which is different from the positioning element 130 will be described in detail below.

Reference is made again to FIG. 9. In this embodiment, the positioning element 330 is fixed on the back board 110 by the opening OP2. As shown in FIG. 9, the positioning element 330 further includes a first sidewall 331, a second sidewall 332, and a filling block 333. In detail, the filling block 333 further includes a first auxiliary bump 3331, a second auxiliary bump 3332, and a main bump 3333. As shown in FIG. 9, the first auxiliary bump 3331 and the second auxiliary bump 3332 are separated from the main bump 3333, respectively.

In some embodiments, the filling block 333 is connected to the first sidewall 331 and the second sidewall 332, and the main bump 3333 is engaged with the opening OP2. The first sidewall 331 faces toward the inner surface 111si of the first side plate 111, and the second sidewall 332 faces toward the inner surface 112si of the second side plate 112.

Reference is made again to FIG. 9. In some embodiments, the first side plate 111 has a through hole R5, and the second side plate 112 has a through hole R6. In some embodiments, the through hole R5 and the through hole R6 are separated from the opening OP2, respectively. In this case, the shape of the through hole R5 and the through hole R6 matches the shape of the first auxiliary bump 3331 and the second auxiliary bump 3332, respectively. In this embodiment, the through hole R5 and the through hole R6 are configured to block the movement of the positioning element 330 in the third direction (e.g., the z-direction).

Figure 10:
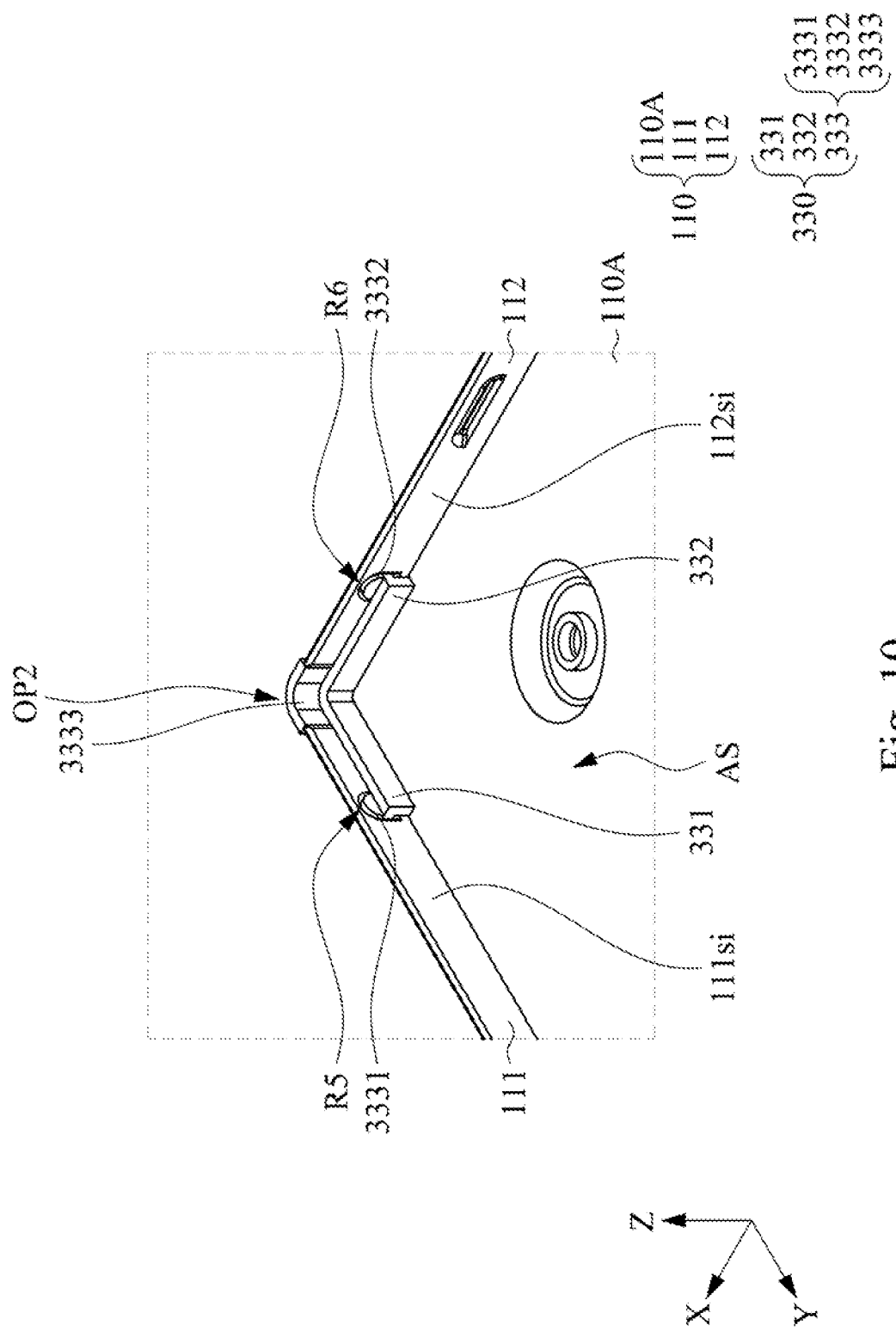
FIG. 10 is a partial perspective view of the positioning element engaged with the back board in accordance with yet another embodiment of the present disclosure.

Reference is made to FIG. 10. FIG. 10 is a perspective view of the positioning element 330 engaged with the back board 110 according to yet another embodiment of the present disclosure. In a practical scenario, when the user moves the positioning element 330 from the accommodating space AS toward the outer side of the first side plate 111 and the second side plate 112 and allows the positioning element 330 to be engaged with the opening OP2 located between the first side plate 111 and the second side plate 112, the main bump 3333 of the positioning element 330 is engaged with the opening OP2, and the first auxiliary bump 3331 and the second auxiliary bump 3332 are respectively engaged with the through hole R5 and the through hole R6, and when the main bump 3333 is temporarily deformed (e.g., compressed) by the constraints of the opening OP2, the main bump 3333 returns to its original shape and is firmly engaged with the opening OP2. In addition, when the user moves the positioning element 330 from the accommodating space AS toward the outer side of the first side plate 111 and the second side plate 112 and allows the positioning element 330 to be engaged with the opening OP2 located between the first side plate 111 and the second side plate 112, the first side plate 111 and the second side plate 112 are respectively configured to allow the first sidewall 331 and the second sidewall 332 to abut against, so as to prevent the positioning element 330 from continuous moving along the first direction (e.g., y-direction) and/or the second direction (e.g., x-direction). Moreover, when the user moves the positioning element 330 from the accommodating space AS toward the outer side of the first side plate 111 and the second side plate 112 and allows the positioning element 330 to be engaged with the opening OP2 located between the first side plate 111 and the second side plate 112, the first auxiliary bump 3331 and the second auxiliary bump 3332 are respectively limited by the through hole R5 and the through hole R6, so as to prevent the positioning element 330 from continuously moving along the third direction (e.g., the z-direction). In this way, the positioning element 330 can be fixed on the back board 110 to achieve the effect that the positioning element 130 can be positioned relative to the back board 110 in three dimensions.

Figure 11:
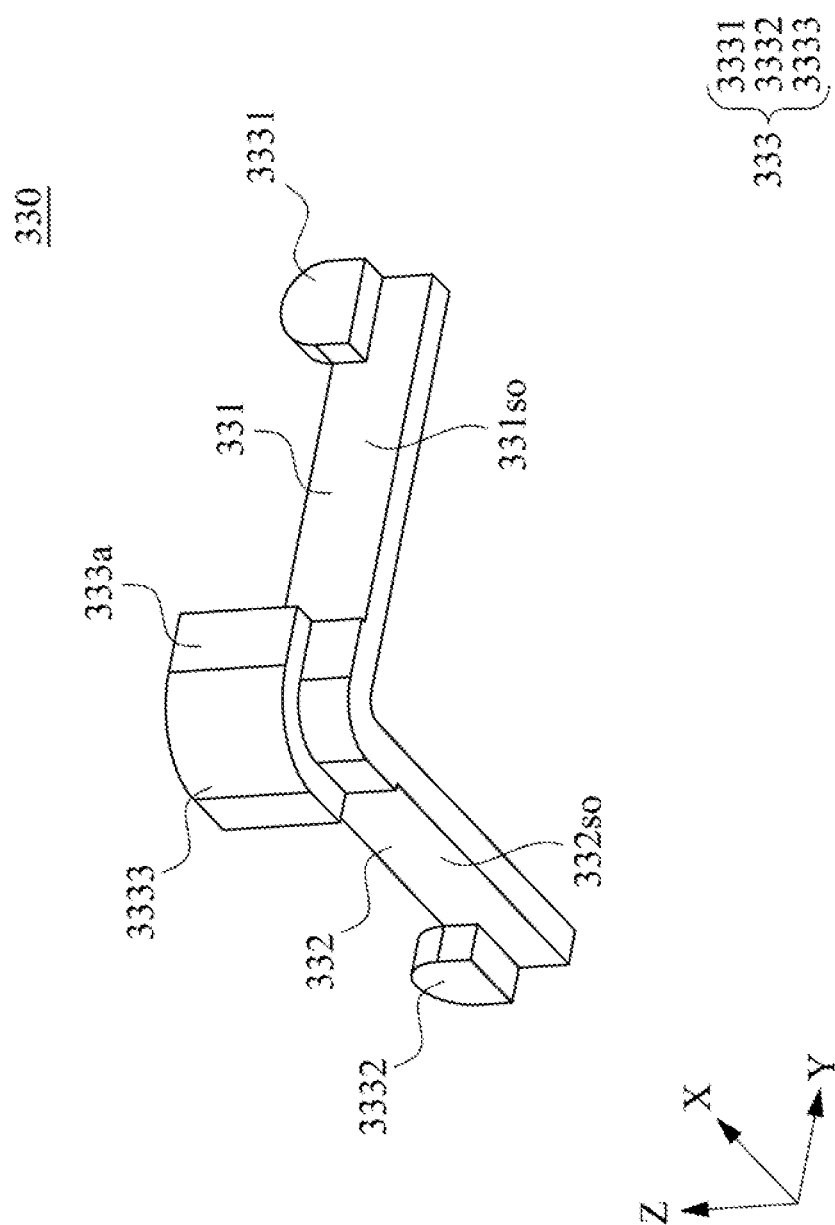
FIG. 11 is a perspective view of the positioning element in accordance with yet another embodiment of the present disclosure.

Reference is made to FIG. 11. FIG. 11 is a perspective view of the positioning element 330 according to yet another embodiment of the present disclosure. As shown in FIG. 11, the main bump 3333 is disposed on an outer surface 331so of the first sidewall 331 and an outer surface 332so of the second sidewall 332. In some embodiments, the first auxiliary bump 3331 is connected to the first sidewall 331. In some embodiments, the second auxiliary bump 3332 is connected to the second sidewall 332. As shown in FIG. 11, the main bump 3333 has a surface 333a, and the surface 333a is located on a side of the main bump 3333 away from the first sidewall 331 and/or the second sidewall 332.

In some embodiments, as shown in FIG. 11, the first auxiliary bump 3331 is located on a side of the first sidewall 331 away from the main bump 3333. In some embodiments, the second auxiliary bump 3332 is located on the side of the second sidewall 332 away from the main bump 3333. However, the present disclosure is not intended to limit the position of the first auxiliary bump 3331 on the first sidewall 331 and the position of the second auxiliary bump 3332 on the second sidewall 332.

Based on the above discussions, it can be seen that in the display device and its positioning element thereof of the present disclosure, the presence of the opening between the first side plate and the second side plate, and the positioning element has the corresponding first sidewall, the corresponding second sidewall, and the corresponding filling block, so the positioning element can be stably positioned by the opening, the first side plate, and the second side plate at least in two dimensions as the positioning element moves away from the display assembly. In the display device and its positioning element of the present disclosure, since the first side plate and the second side plate respectively include the first extending bump and the second extending bump and have the recess or the through hole, and the positioning element includes the first extending bump, the second extending bump, the first auxiliary bump, and the second auxiliary bump corresponding to the recess or the through hole, so that the first protruding portion and the second protruding portion can respectively block the first extending bump and the second extending bump in the third dimension as the positioning element moves away from the display assembly. Alternatively, the through hole can block the first auxiliary bump and the second auxiliary bump in the third dimension respectively so as to achieve effect of the positioning element firmly fixed relative to the back board in three dimensions. In this way, the display device of the present disclosure has the integrally formed back board and positioning elements thereof. After the back board and the positioning element are formed, no additional processing is required. During the assembling process of the display device, not only the purposes of positioning element firmly fixed on the back board and preventing light leakage at the corners of the back board can be achieved, but also can reduce the risk of collision damage to optical materials or optical films, and meet the demand for reducing production costs at the same time.

Although the present disclosure has been disclosed as above in the manner of embodiment, it is not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A display device, comprising:
    a back board, comprising:
        a bottom plate;
        a first side plate bent from the bottom plate and extended in a first direction; and
        a second side plate bent from the bottom plate and extended in a second direction different from the first direction, wherein the bottom plate, the first side plate, and the second side plate jointly define an accommodating space, and an opening is located between the first side plate and the second side plate;
    a display assembly fixed on the back board and located in the accommodating space; and
    a positioning element fixed on the back board, comprising:
        a filling block engaged with the opening;
        a first sidewall connected to the filling block and facing toward an inner side surface of the first side plate; and
        a second sidewall connected to the filling block and facing toward an inner side surface of the second side plate,
    wherein the first side plate further comprises a first protruding portion, the second side plate further comprises a second protruding portion, and the filling block is partially located between the bottom plate and the first protruding portion and is partially located between the bottom plate and the second protruding portion.

2. The display device of claim 1, wherein the first sidewall and the second sidewall respectively abut against the first side plate and the second side plate as the filling block is engaged with the opening.

3. The display device of claim 1, wherein the inner side surface of the first side plate is perpendicular to the inner side surface of the second side plate.

4. The display device of claim 1, wherein the filling block further comprises:
    a main bump;
    a first extending bump engaged with an edge of the first side plate adjacent to the opening; and
    a second extending bump engaged with an edge of the second side plate adjacent to the opening.

5. The display device of claim 4, wherein the main bump is connected to the first extending bump and the second extending bump.

6. The display device of claim 4, wherein the first extending bump protrudes in the first direction, and the second extending bump protrudes in the second direction.

7. A display device comprising:
- a back board, comprising:
  - a bottom plate;
  - a first side plate bent from the bottom plate and extended in a first direction; and
  - a second side plate bent from the bottom plate and extended in a second direction different from the first direction, wherein the bottom plate, the first die plate, and the second side plate jointly define an accommodating space, and an opening is located between the first side plate and the second side plate;
- a display assembly fixed on the back board and located in the accommodating space; and
- a positioning element fixed on the back board, comprising:
  - a filling block engaged with the opening;
  - a first sidewall connected to the filling block and facing toward in inner side surface of the first side plate; and
  - a second sidewall connected to the filling block and facing toward an inner side surface of the second side plate,
  - wherein the filling block further comprises:
    - a main bump;
    - a first auxiliary bump engaged with a first through hole of the first sidewall, wherein the first through hole has an enclosed inner edge; and
    - a second auxiliary bump engaged with a second through hole of the second sidewall, wherein the second through hole has an enclosed inner edge, and the first auxiliary bump and the second auxiliary bump are respectively separated from the main bump, wherein the first through hole and the second through hole are respectively separated from the opening.

8. The display device of claim 7, wherein the first auxiliary bump is located on a side of the first sidewall away from the main bump, and the second auxiliary bump is located on a side of the second sidewall away from the main bump.

9. The display device of claim 7, wherein the main bump has a surface located on a side of the main bump away from the first sidewall and/or the second sidewall.

10. The display device of claim 9, wherein the surface of the main bump is a curved surface.

11. The display device of claim 7, wherein the first sidewall and the second sidewall respectively abut against the first side plate and the second side plate as the main bump is engaged with the opening.

12. The display device of claim 7, wherein the display assembly further comprises:
- a reflective display disposed on the bottom plate;
- a light guide plate disposed on the reflective display;
- a diffuser disposed on a side of the light guide plate away from the reflective display;
- a lower prism sheet disposed on a side of the diffuser away from the reflective display; and
- an upper prism sheet disposed on the lower prism sheet.

13. A display device, comprising:
- a back board, comprising:
  - a bottom plate;
  - a first side plate bent from the bottom plate and extended in a first direction, and the first side plate having a first outer side surface; and
  - a second side plate bent from the bottom plate and extended in a second direction different from the first direction, and the second side plate having a second outer side surface, wherein the bottom plate, the first side plate, and the second side plate jointly define an accommodating space, and an opening is located between the first side plate and the second side plate;
- a display assembly fixed on the back board and located in the accommodating space; and
- a positioning element fixed on the back board, comprising:
  - a filling block engaged with the opening;
  - a first sidewall connected to the filling block and facing toward an inner side surface of the first side plate; and
  - a second sidewall connected to the filling block and facing toward an inner side surface of the second side plate,
  - wherein the filling block has a surface located on a side of the filling block away from the first sidewall and the second sidewall, the surface protrudes from or leveled with the second outer side surface of the second side plate, and the filling block does not cover the second outer side surface of the second side plate,
  - wherein the first side plate further comprises a first protruding portion extended from an edge of the first side plate close to the opening, the second side plate further comprises a second protruding portion extended from an edge of the second side plate close to the opening, and the filling block is partially located between the bottom plate and the first protruding portion and is partially located between the bottom plate and the second protruding portion.

14. The display device of claim 13, wherein the filling block further comprises:
- a main bump;
- a first extending bump extended from the main bump and connected to the first sidewall; and
- a second extending bump extended from the main bump and connected to the second sidewall.

15. The display device of claim 14, wherein the first extending bump protrudes in the first direction, and the second extending bump protrudes in the second direction.

16. The display device of claim 13, wherein the filling block further comprising:
- a main bump;
- a first auxiliary bump engaged with a first through hole of the first sidewall; and
- a second auxiliary bump engaged with a second through hole of the second sidewall, and the first auxiliary bump and the second auxiliary bump are respectively separated from the main bump, wherein the first through hole and the second through hole are respectively separated from the opening.

17. The display device of claim 16, wherein the first auxiliary bump is located on a side of the first sidewall away from the main bump, and the second auxiliary bump is located on a side of the second sidewall away from the main bump.

18. The display device of claim 13, wherein the filling block has a surface located on a side of the filling block away from the first sidewall and/or the second sidewall.

19. The display device of claim 18, wherein the surface of the filling block is a curved surface.

20. The display device of claim 13, wherein the first sidewall is perpendicular to the second sidewall.

* * * * *